United States Patent
Singhal et al.

(10) Patent No.: US 7,487,492 B1
(45) Date of Patent: Feb. 3, 2009

(54) METHOD FOR INCREASING MANUFACTURABILITY OF A CIRCUIT LAYOUT

(75) Inventors: Ajay Singhal, Fremont, CA (US); Todd Lukanc, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 371 days.

(21) Appl. No.: 11/437,312

(22) Filed: May 19, 2006

(51) Int. Cl.
*G06F 17/50* (2006.01)

(52) U.S. Cl. .............................. 716/21; 716/4; 716/11

(58) Field of Classification Search ........................ None
See application file for complete search history.

(56) References Cited

U.S. PATENT DOCUMENTS

| | | | |
|---|---|---|---|
| 6,775,818 B2 * | 8/2004 | Taravade et al. | 716/21 |
| 6,907,596 B2 * | 6/2005 | Kobayashi et al. | 716/19 |
| 7,340,706 B2 * | 3/2008 | Golubtsov et al. | 716/5 |
| 2007/0044049 A1 * | 2/2007 | Adams et al. | 716/4 |

* cited by examiner

*Primary Examiner*—Leigh Marie Garbowski
(74) *Attorney, Agent, or Firm*—Farjami & Farjami LLP

(57) ABSTRACT

According to one exemplary embodiment, a method for increasing manufacturability of a circuit layer includes determining a threshold value for at least one image property from a repetitive section of the circuit layout. According to this embodiment, the method further includes performing a simulated lithographic process using the circuit layout to determine a number of simulated values of the at least one image property for a non-repetitive section of the circuit layout. The method further includes comparing each of the simulated values with the threshold value to determine printability of the non-repetitive section of the circuit layout prior to lithographically printing the circuit layout on a wafer. The method further includes modifying the non-repetitive section of the circuit layout if the threshold value is greater than at least one of the simulated values. By modifying the non-repetitive section of the circuit layout, manufacturability of the circuit layout can be increased.

18 Claims, 2 Drawing Sheets

METHOD FOR INCREASING MANUFACTURABILITY OF A CIRCUIT LAYOUT

TECHNICAL FIELD

The present invention is generally in the field of fabrication of semiconductor devices. More specifically, the present invention is in the field of semiconductor circuit lithography.

BACKGROUND ART

During fabrication of a semiconductor device, such as a semiconductor memory or logic device, a circuit layout can be generated from a circuit diagram of the semiconductor device. The circuit layout can be checked to ensure compliance with a specified set of design rules, which are a set of geometric constraints or rules that features in the circuit layout must conform to for a particular semiconductor manufacturing process. After the circuit layout has been checked to ensure compliance with the applicable set of design rules, the circuit layout can be transferred to a semiconductor wafer by using a lithographic process.

However, although the circuit layout conforms to applicable design rules, one section of the circuit layout may fail while another section of the circuit layout may not fail when the circuit layout is lithographically transferred to the semiconductor wafer. For example, a peripheral section of a memory circuit layout may fail while a core section of the memory circuit layout may not fail as a result of the peripheral and core sections of the memory circuit layout being lithographically transferred to the semiconductor wafer. Thus, even though the circuit layout conforms to applicable design rules, the circuit layout can fail as a result of being lithographically transferred to a wafer, which undesirably decreases manufacturing yield.

Thus, there is a need in the art for a method for determining whether a circuit layout that conforms to applicable design rules will fail as a result of being lithographically transferred to a wafer prior to transferring the circuit layout to the wafer.

SUMMARY

The present invention is directed to a method for increasing manufacturability of a circuit layout. The present invention addresses and resolves the need in the art for a method for determining whether a circuit layout that conforms to applicable design rules will fail as a result of being lithographically transferred to a wafer prior to transferring the circuit layout to the wafer.

According to one exemplary embodiment, a method for increasing manufacturability of a circuit layer includes determining a threshold value for at least one image property from a repetitive section of the circuit layout. The at least one image property can be Imax, Imin, Slope, Contrast, or Curvature for example. The repetitive section of the circuit layout can be printed on a wafer using a lithographic process such that the lithographic process does not cause the repetitive section of the circuit layout to fail. The repetitive section of the circuit layout can include a number of features, where the features in the repetitive section of the circuit layout are arranged in a repetitive geometric design. The repetitive section of the circuit layout can be a core section of a memory device, where the core section of the memory device includes a number of memory cells, for example.

According to this embodiment, the method further includes performing a simulated lithographic process using the circuit layout to determine a number of simulated values of the at least one image property for a non-repetitive section of the circuit layout. The non-repetitive section of the circuit layout can include a number of features, where the features in the non-repetitive section of the circuit layout are arranged in a non-repetitive geometrical design. The non-repetitive section of the circuit layout can be a peripheral section of a memory device, for example. The method further includes comparing each of the simulated values with the threshold value to determine printability of the non-repetitive section of the circuit layout prior to lithographically printing the circuit layout on a wafer. The method further includes modifying the non-repetitive section of the circuit layout if the threshold value is greater than at least one of the simulated values. By modifying the non-repetitive section of the circuit layout, manufacturability of the circuit layout can be increased. Other features and advantages of the present invention will become more readily apparent to those of ordinary skill in the art after reviewing the following detailed description and accompanying drawings.

DETAILED DESCRIPTION OF THE INVENTION

Figure 1:
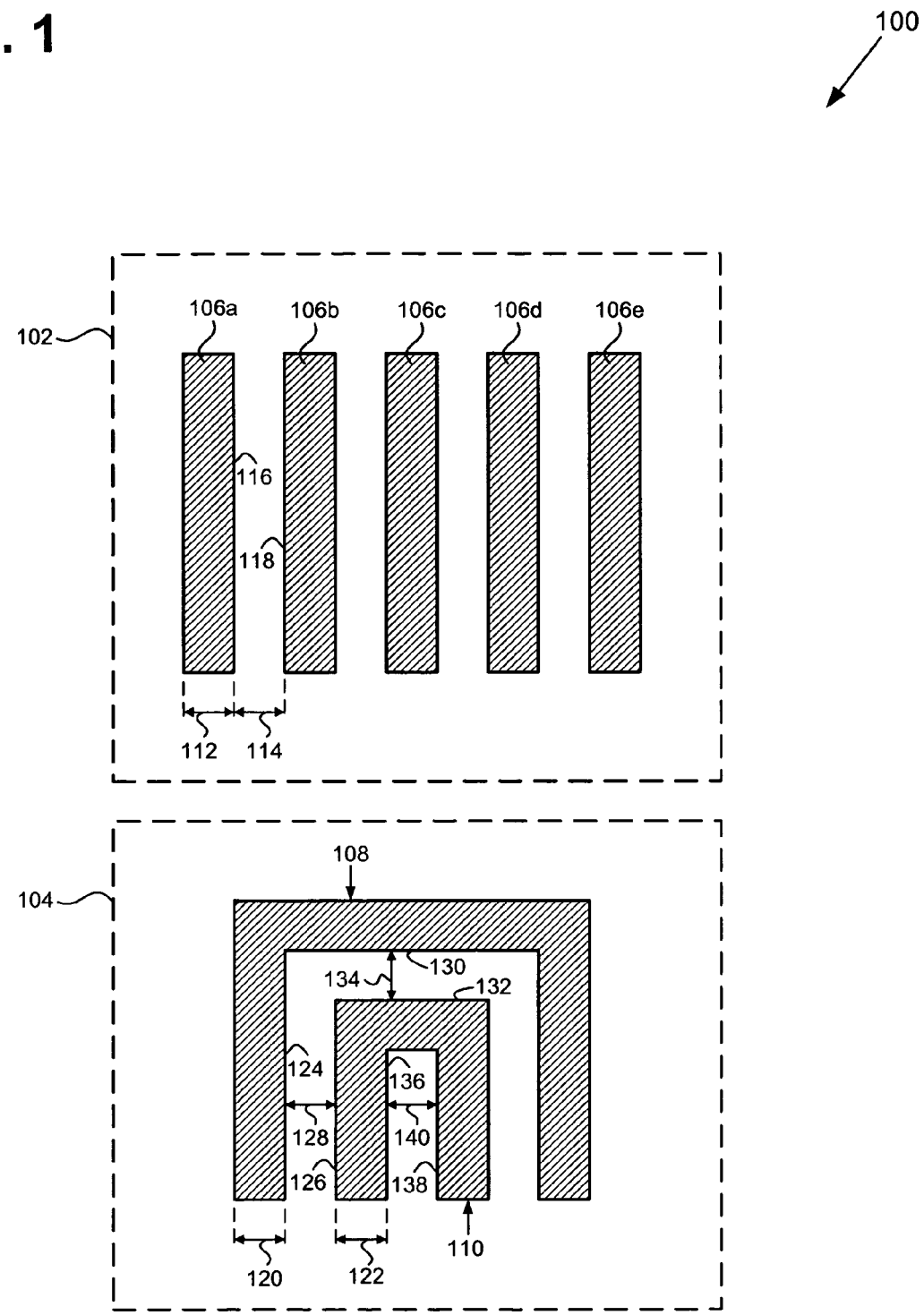
FIG. 1 illustrates a top view of an exemplary circuit layout, in accordance with one embodiment of the present invention.

The present invention is directed to a method for increasing manufacturability of a circuit layout. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings. It should be borne in mind that, unless noted otherwise, like or corresponding elements among the figures may be indicated by like or corresponding reference numerals.

FIG. 1 shows a top view of an exemplary circuit layout in accordance with one embodiment of the present invention. Circuit layout 100 includes repetitive section 102 and non-repetitive section 104. Repetitive section 102 includes interconnect lines 106a, 106b, 106c, 106d, and 106e (hereinafter "interconnect lines 106a through 106e) and non-repetitive section 104 includes interconnect lines 108 and 110. Circuit layout 100 can be, for example, a layout of memory circuit, such as a dynamic random-access memory (DRAM) circuit, a static random-access memory (SRAM) circuit, or flash memory circuit. Circuit layout 100 can also be a layout of a logic circuit, for example. It is noted that circuit layout 100 can include many design layers, such as active, contact, polysilicon, and via layers, which are not shown in FIG. 1 so as not to obscure the invention.

As shown in FIG. 1, interconnect lines 106a through 106e are situated in a parallel arrangement in repetitive section 102 of circuit layout 100. Repetitive section 102 can include a number of repetitive features (e.g. interconnect lines 106a through 106e), where the width of the features (e.g. wide 112 of interconnect lines 106a through 106e) and the spacing between the features (e.g. space 114 between adjacent interconnect lines) define a uniform geometry. In one embodiment, repetitive section 102 can comprise a layout of a section of a memory device, such as a core array, which can include a number of memory cells arranged in a repetitive geometrical design. Interconnect lines 106a through 106e each have width 112, which can vary, for example, between 10.0 nanometers (nm) and 5000.0 nm. The edges of adjacent interconnect lines, such as respective edges 116 and 118 of interconnect lines 106a and 106b, are separated by space 114, which can be between 10.0 nm and 5000.0 nm, for example.

Also shown in FIG. 1, interconnect lines 108 and 110 are situated in non-repetitive section 104 of circuit layer 100. Non-repetitive section 104 can include features (e.g. interconnect lines 108 and 110) that are situated in a non-repetitive, non-uniform geometrical arrangement. In one embodiment, non-repetitive section 104 can comprise a layout of a section of a memory device, such as peripheral section, having a non-uniform geometrical arrangement. Interconnect line 108 has width 120 and interconnect line 110 has width 122. Width 120 and width 122 can be between 10.0 μm and 5000.0 nm, for example. As further shown in FIG. 1, respective edges 124 and 126 of interconnect lines 108 and 110 are separated by space 128, respective edges 130 and 132 of interconnect lines 108 and 110 are separated by space 134, and edges 136 and 138 of interconnect line 110 are separated by space 140. Spaces 128, 134, and 140 can be between 10.0 nm and 5000.0 nm, for example.

In a repetitive, uniform section of a circuit layout, such as repetitive section 102 of circuit layout 100, circuit layout corrections, such as adjustments to line width and spacing between lines, can be accounted for in a predictable manner when the circuit layout is lithographically transferred to a semiconductor wafer. In contrast, in a non-repetitive, non-uniform section of the circuit layout, such as non-repetitive section 104 of circuit layer 100, circuit layout corrections are less predictable when the circuit layout is lithographically transferred to the wafer. For example, although the same design rules can be used to lay out repetitive and non-repetitive sections of a circuit, the non-repetitive section of the circuit layout may fail while the repetitive section of the circuit layout may not fail as a result of being lithographically transferred to (i.e. printed on) a wafer. By using the method of the present invention, portions of a section of the circuit layout (e.g. portions of non-repetitive section 104) that can fail as a result of being lithographically transferred to or lithographically printed on a wafer can be detected and corrected prior to lithographically transferring the circuit layout to the wafer by using a non-failing section of the circuit layout (e.g. repetitive section 102) as an internal reference.

In the present invention, image properties can be simulated for a lithographic process on circuit layout 100. The simulated image properties can include "Imax," "Imin," "Slope," and "Contrast." "Imax" and "Imin" can be defined as respective maximum and minimum light intensities of a feature, such as a line, in the circuit layout in a simulated lithographic process, and "Contrast" can be defined as (Imax−Imin)/Imax. "Slope" can be defined as the rate at which light intensity varies at an edge of a feature in the circuit layout in the simulated lithographic process. The simulated image properties can further include "Curvature," which can be defined as the rate at which Slope is changing at an edge of a feature in the circuit layout in the simulated lithographic process. In other embodiments, one or more different simulated image properties may be defined and utilized in place of or in addition to any combination of Imax, Imin, Slope, Contrast, and Curvature.

In the present embodiment, similar features of sections 102 and 104 of circuit layout 100 can be laid out in accordance with the same design rules and can have similar dimensions. For example, space 114 between adjacent interconnect lines (e.g. interconnect lines 106a and 106b) in repetitive section 102 and spaces 128 and 134 between interconnect lines 108 and 110 in non-repetitive section 104 can be equal in dimension and within design rule specifications. Similarly, for example, width 112 of interconnect lines 106a through 106e in repetitive section 102 and respective widths 120 and 122 of interconnect lines 108 and 110 can be equal in dimension and within design rule specifications. However, repetitive section 102 does not fail as a result of being lithographically printed on a semiconductor wafer while non-repetitive section 104 is prone to failure.

In the present embodiment, image properties, such as Imax, Imin, Slope, Contrast, and Curvature, can be determined from repetitive section 102 of circuit layout 100 by simulating a lithographic process. The simulated lithographic process can be performed by a processor using Calibre® simulation software or other suitable simulation software. For example, the processor may be a microprocessor or other suitable type of processor that can be configured to execute the simulation software. For example, the processor may be housed in a workstation, a personal computer, a server, or other suitable computing device. The simulation software can reside in a computer readable medium such as RAM memory, a hard disk, a removable disk, or any other suitable form of computer readable medium known in the art. Threshold values of the image properties can be determined from the edges of features in repetitive section 102 of circuit layout 100 and can be selected such that there is no manufacturing failure in repetitive section 102 when it is printed on (i.e. transferred to) a semiconductor wafer using a lithographic process.

Another simulated lithographic process can then be performed using repetitive section 102 and non-repetitive section 104 of circuit layout 100 to determine simulated image property values for one or more image properties, such as Imax, Imin, Slope, and Contrast for the edges of each feature in repetitive section 102 and non-repetitive section 104. The simulated image property values can then be compared to corresponding threshold image property values for each edge of each feature in repetitive section 102 and non-repetitive section 104 of circuit layout 100. If the simulated image property value is less than the corresponding threshold image property value for any edge of any feature in repetitive section 102 or non-repetitive section 104 of circuit layout 100, the portion of repetitive section 102 or non-repetitive section 104 that includes that feature can be indicated (i.e. highlighted) by the processor by setting a flag or other suitable identification mark in the simulation software.

Since the threshold image property values are determined from repetitive section 102 of circuit layout 100, no portion of repetitive section 102 should be flagged in the simulated lithographic process. A flagged portion of non-repetitive section 104 indicates a portion of the circuit layout that is prone to failure (i.e. a marginal portion of the circuit layout) when it (i.e. the flagged portion of the circuit layout) is printed on a semiconductor wafer in a lithographic process. A flagged portion of non-repetitive section 104 of circuit layout 100 can be further examined to determine the particular feature or space between features that requires an appropriate modification to ensure that the flagged portion of non-repetitive section 104 does not fail when it is lithographically printed on a wafer. For example, if edges 136 and 138 of interconnect line 110 were included in a flagged portion of non-repetitive section 104 in the simulated lithographic process, space 140, which separates edges 136 and 138 of interconnect line 110, might have to be increased such that the flagged portion of non-repetitive section 104 can be lithographically printed on a wafer without failing.

After the flagged portion of non-repetitive section 104 has been appropriately modified, another simulated lithographic process can be performed by the processor to determine if the simulated image property values of edges of the features in the modified portion of non-repetitive section 104 are greater than the corresponding threshold image property values. The cycle of modification and performance of the simulated lithographic process can be repeated until the flagged portion of non-repetitive section 104 is no longer flagged.

Thus, in the present invention, a repetitive section of a circuit layout (e.g. repetitive section 102 of circuit layout 100) is utilized as an internal calibration reference to determine "printability" of a non-repetitive section (e.g. non-repetitive section 104) of the circuit layout prior to lithographically printing the non-repetitive section of the circuit layout on a semiconductor wafer. In the present application, "printability" of a section of a circuit layout refers to whether the section of the circuit layout can be lithographically printed on a semiconductor wafer without failure prior to lithographically printing the section of the circuit layout on the wafer. By determining printability of a non-repetitive section of a circuit layout prior to printing the non-repetitive section of the circuit layout on a wafer, the present invention can determine a portion of the non-repetitive section of the circuit layout that is prone to failure when it (i.e. the non-repetitive section) is printed on the wafer. As a result, the portion of the non-repetitive section of the circuit layout that is prone to failure as a result a lithographic printing process can be appropriately modified such that the failure-prone portion of the non-repetitive section can be lithographically printed on a wafer without failure. Thus, the present invention increases manufacturability of the circuit layout and, thereby, increases manufacturing yield.

The method of the present invention can also be utilized to accommodate process variations (i.e. a "process window") in the lithographic simulation process. For example, a lithographic simulation process parameter, such as "focus," can have a range of variation. Also, for each process point in the variation range of the "focus" parameter, there can be an image property variation range. Thus, for example, three process points, such as two end points and a center point, in the variation range of the "focus" parameter can be utilized with three simulated image properties values from the image property variation range to perform nine different lithographic simulation processes using a repetitive section of the circuit layout. A unique set of threshold values can then be determined from the repetitive section for each of the nine different lithographic simulation processes. The unique set threshold values, which account for process variations in the lithographic simulation process, can then be used to determine "printability" of a non-repetitive section of the circuit layout prior to lithographically printing the non-repetitive section of the circuit layout on a semiconductor wafer.

The method of the present invention can also be applied to determine printability of a non-repetitive section of a new circuit layout, which may use the same design rules and technology as a previous circuit layout, by utilizing threshold values that are determined from a repetitive section of the previous circuit layout. Additionally, the method of the present invention can be applied to a new circuit layout that does not include repetitive and non-repetitive sections to determine a section or sections of the new circuit layout that are prone to lithographic printing failure by using threshold values determined from the previous circuit layout as a calibration reference.

The method of the present invention can be further applied to determine a section or sections of a new or similar circuit layout that might be prone to lithographic printing failure by using threshold values determined from a previous circuit layout as a calibration reference, where the new or similar circuit layout is being scaled down to smaller feature dimensions using a new generation technology.

Figure 2:
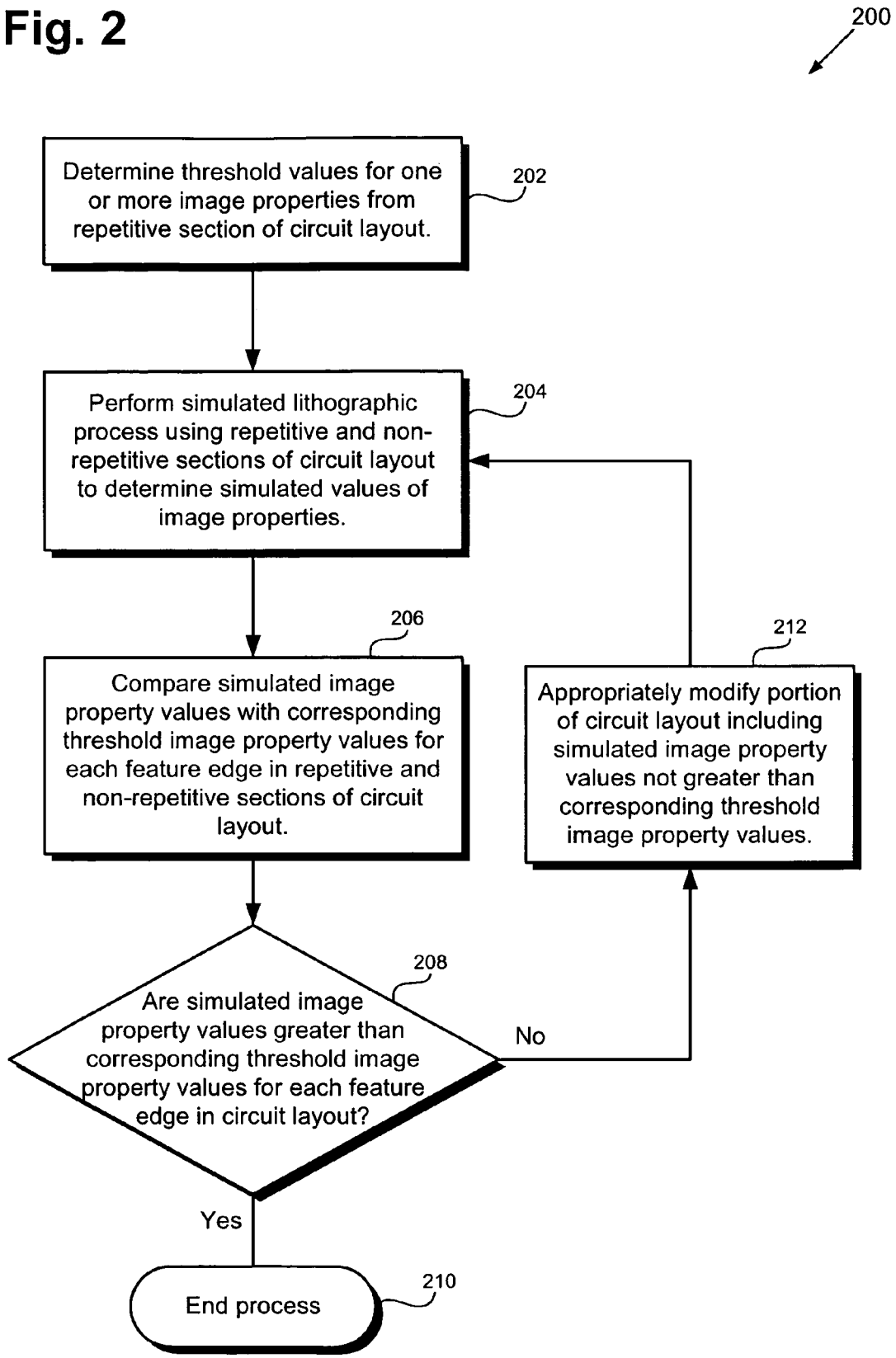
FIG. 2 shows a flowchart illustrating the steps taken to implement an embodiment of the present invention.

FIG. 2 shows a flowchart illustrating an exemplary method according to an embodiment of the present invention. Certain details and features have been left out of flowchart 200 that are apparent to a person of ordinary skill in the art. For example, a step may consist of one or more substeps or may involve specialized equipment or materials, as known in the art. Steps 202, 204, 206, 208, 210, and 212 indicated in flowchart 200 are sufficient to describe one embodiment of the present invention; other embodiments of the invention may utilize steps different from those shown in flowchart 200.

Referring now to step 202 in FIG. 2, at step 202 of flowchart 200, threshold values for one or more image properties are determined from repetitive section 102 of circuit layout 100. In the present embodiment, repetitive section 102 can include interconnect lines 106a through 106e, which are arranged in a repetitive, uniform geometrical design. In one embodiment, repetitive section 102 can include a core section of a memory device including memory cells arranged in a repetitive geometrical design. In the present embodiment, image properties, which can be determined from the edges of features in repetitive section 102, can include Imax, Imin, Slope, and Contrast. The image properties can be determined by simulating a lithographic process including repetitive section 102 of circuit layout 100 by utilizing a processor to execute Calibre® simulation software or other suitable simulation software. Threshold values of the image properties can be selected such that repetitive section 102 can be lithographically printed on a semiconductor wafer without failing as a result of the lithographical process.

At step 204, a simulated lithographic process can be performed using repetitive section 102 and non-repetitive section 104 of circuit layout 100 to determine simulated image property values. In the present embodiment, non-repetitive section 104 can include interconnect lines 108 and 110, which are arranged in a non-repetitive, non-uniform geometrical design. In one embodiment, non-repetitive section 104 can include a peripheral section of the memory device. The simulated image property values can be determined for each edge of each feature (e.g. edge 116 of interconnect line 106a in repetitive section 102) in repetitive section 102 and non-repetitive section 104 of circuit layout 100. At step 206, the simulated image property values can be compared with corresponding threshold image property values for the edges of each feature in repetitive section 102 and non-repetitive section 104. The simulated image property values can be compared with the corresponding threshold image property values by a processor situated in a suitable computing device and utilizing suitable simulation software, for example.

At step 208, if the simulated image property values are greater than the corresponding threshold image property values for each edge of each feature in repetitive section 102 and non-repetitive section 104 of circuit layout 100, flowchart 200 proceeds to step 210, where the invention's process ends. If the simulated image property values are not greater than the corresponding threshold image property values for each edge of each feature in repetitive section 102 and non-repetitive section 104 of circuit layout 100, flowchart 200 proceeds to step 212. At step 212, the portion of circuit layout 100 that includes simulated image property values that are not greater than corresponding threshold image property values can be appropriately modified. For example, if a portion of non-repetitive section 104 is flagged to indicate that respective edges 130 and 132 of interconnect lines 108 and 110 have simulated image property values that are not greater than corresponding threshold image property values, space 134 might have to be increased to provide more separation between edges 130 and 132.

After the flagged portion of circuit layout 100 has been appropriately modified, flowchart 200 proceeds to step 204, where another simulated lithographic process is performed to determine whether the modified portion of circuit layout 100 has simulated image property values that are greater than corresponding threshold image property values. Steps 204, 206, 208, and 212 of flowchart 200 can be repeated until the flagged portion of circuit layout 100 is no longer flagged.

Thus, as discussed above, the present invention utilizes a repetitive section of a circuit layout to determine printability of a non-repetitive section of the circuit layout prior to lithographically printing the non-repetitive section on a semiconductor wafer. As a result, the present invention can determine a portion of the non-repetitive section of the circuit layout that is prone to failure when it (i.e. the non-repetitive section) is printed on the wafer prior to lithographically printing the circuit layout on the wafer. As a result, the failure-prone portion of the non-repetitive section of the circuit layout can be appropriately modified such that it (i.e. the failure-prone portion of the non-repetitive section) can be lithographically printed on a wafer without failure. Thus, the present invention increases manufacturability of the circuit layout and, thereby, increases manufacturing yield.

From the above description of exemplary embodiments of the invention it is manifest that various techniques can be used for implementing the concepts of the present invention without departing from its scope. Moreover, while the invention has been described with specific reference to certain embodiments, a person of ordinary skill in the art would recognize that changes could be made in form and detail without departing from the spirit and the scope of the invention. The described exemplary embodiments are to be considered in all respects as illustrative and not restrictive. It should also be understood that the invention is not limited to the particular exemplary embodiments described herein, but is capable of many rearrangements, modifications, and substitutions without departing from the scope of the invention.

Thus, a method for increasing manufacturability of a circuit layout has been described.

The invention claimed is:

1. A method for increasing manufacturability of a circuit layout, said method comprising steps of:
    determining a threshold value for at least one image property from a repetitive section of said circuit layout;
    performing a simulated lithographic process using said circuit layout to determine a first plurality of simulated values of said at least one image property for a non-repetitive section of said circuit layout;
    comparing each of said first plurality of simulated values with said threshold value to determine printability of said non-repetitive section of said circuit layout prior to lithographically printing said circuit layout on a wafer.

2. The method of claim 1 further comprising a step of modifying said non-repetitive section of said circuit layout if at least one of said first plurality of simulated values is less than said threshold value.

3. The method of claim 2 wherein said step of modifying said non-repetitive section of said circuit layout increases manufacturability of said circuit layout.

4. The method of claim 1 wherein said at least one image property is selected from the group consisting of Imax, Imin, Slope, Contrast, and Curvature.

5. The method of claim 1 wherein said repetitive section of said circuit layout is printed on said wafer using a lithographic process such that said lithographic process does not cause said repetitive section of said circuit layout to fail.

6. The method of claim 1 wherein said repetitive section of said circuit layout comprises a plurality of features, wherein said plurality of features in said repetitive section of said circuit layout is arranged in a repetitive geometrical design.

7. The method of claim 1 wherein said non-repetitive section of said circuit layout comprises a plurality of features, wherein said plurality of features in said non-repetitive section of said circuit layout is arranged in a non-repetitive geometrical design.

8. The method of claim 1 wherein said repetitive section of said circuit layout comprises a core section of a memory device, wherein said core section of said memory device comprises a plurality of memory cells.

9. The method of claim 8 wherein said non-repetitive section of said circuit layout comprises a peripheral section of said memory device.

10. A method for increasing manufacturability of a circuit layout, said method comprising steps of:
    determining a threshold value for at least one image property from a repetitive section of said circuit layout;
    performing a simulated lithographic process using said circuit layout to determine a first plurality of simulated values of said at least one image property for a non-repetitive section of said circuit layout;
    comparing each of said first plurality of simulated values with said threshold value;
    modifying said non-repetitive section of said circuit layout if at least one of said first plurality of simulated values is less than said threshold value.

11. The method of claim 10 wherein said step of comparing each of said first plurality of simulated values with said threshold value is performed to determine printability of said non-repetitive section of said circuit layout prior to lithographically printing said circuit layout on a wafer.

12. The method of claim 10 wherein said step of modifying said non-repetitive section of said circuit layout increases manufacturability of said circuit layout.

13. The method of claim 10 wherein said at least one image property is selected from the group consisting of Imax, Imin, Slope, Contrast, and Curvature.

14. The method of claim 10 wherein said repetitive section of said circuit layout is printed on said wafer using a lithographic process such that said lithographic process does not cause said repetitive section of said circuit layout to fail.

15. The method of claim 10 wherein said repetitive section of said circuit layout comprises a plurality of features, wherein said plurality of features in said repetitive section of said circuit layout is arranged in a repetitive geometrical design.

16. The method of claim 10 wherein said non-repetitive section of said circuit layout comprises a plurality of features, wherein said plurality of features in said non-repetitive section of said circuit layout is arranged in a non-repetitive geometrical design.

17. The method of claim 10 wherein said repetitive section of said circuit layout comprises a core section of a memory device, wherein said core section of said memory device comprises a plurality of memory cells.

18. The method of claim 17 wherein said non-repetitive section of said circuit layout comprises a peripheral section of said memory device.

* * * * *